United States Patent [19]

Latz

[11] Patent Number: 5,167,789
[45] Date of Patent: Dec. 1, 1992

[54] APPARATUS FOR COATING A SUBSTRATE

[75] Inventor: Rudolf Latz, Rodgau, Fed. Rep. of Germany

[73] Assignee: Leybold Aktiengesellschaft, Hanau, Fed. Rep. of Germany

[21] Appl. No.: 697,707

[22] Filed: May 9, 1991

[30] Foreign Application Priority Data

Mar. 20, 1991 [DE] Fed. Rep. of Germany ....... 4109018

[51] Int. Cl.$^5$ ............................................. C23C 14/34
[52] U.S. Cl. ......................... 204/298.11; 204/192.12; 204/298.19; 204/298.03
[58] Field of Search ...................... 204/192.12, 298.07, 204/298.08, 298.11, 298.19, 298.2, 298.03, 298.12

[56] References Cited

U.S. PATENT DOCUMENTS

| 4,734,183 | 3/1988 | Wirz et al. ............... 204/298.2 |
| 4,927,513 | 5/1990 | Schultheiss et al. ......... 204/298.2 X |
| 4,931,169 | 6/1990 | Scherer .................. 204/298.11 |
| 5,026,471 | 6/1991 | Latz et al. ................ 204/298.19 |

FOREIGN PATENT DOCUMENTS 0416241 3/1991 European Pat. Off. .
2707144 8/1977 Fed. Rep. of Germany .
2-19461 3/1990 Japan .

Primary Examiner—Nam X. Nguyen
Attorney, Agent, or Firm—Felfe & Lynch

[57] ABSTRACT

In an apparatus for coating a substrate (1) with electrically conductive materials (2), comprising a direct-current and/or an alternating-current source (10 and 38, respectively), which is connected to an electrode disposed in an evacuable coating chamber (15, 15a, 15b) electrically connected with a target (3, 32) which is sputtered and whose sputtered particles deposit themselves on the substrate (1), a process gas can be put into the coating chamber (15, 15a, 15b), toroidal magnetic fields pass through the target and their lines of force issue from the surface of the target (3) at the magnet poles, the target (3) has a substantially elongated, flat, oval shape and is furthermore surrounded by a dark-space shield (34) whose circumferential edge facing the substrate (1) slightly overreaches the front surface of the cathode tub (4), while the magnet system held on a yoke (6) and disposed in the cathode tub (4) is formed of a middle series of narrow magnets (8) extending in the direction of the length of the target, an additional series of narrow magnets (7, 9) disposed on the marginal part of the yoke (6), and two round magnets which are situated one on each end of the middle series of magnets (8).

7 Claims, 1 Drawing Sheet

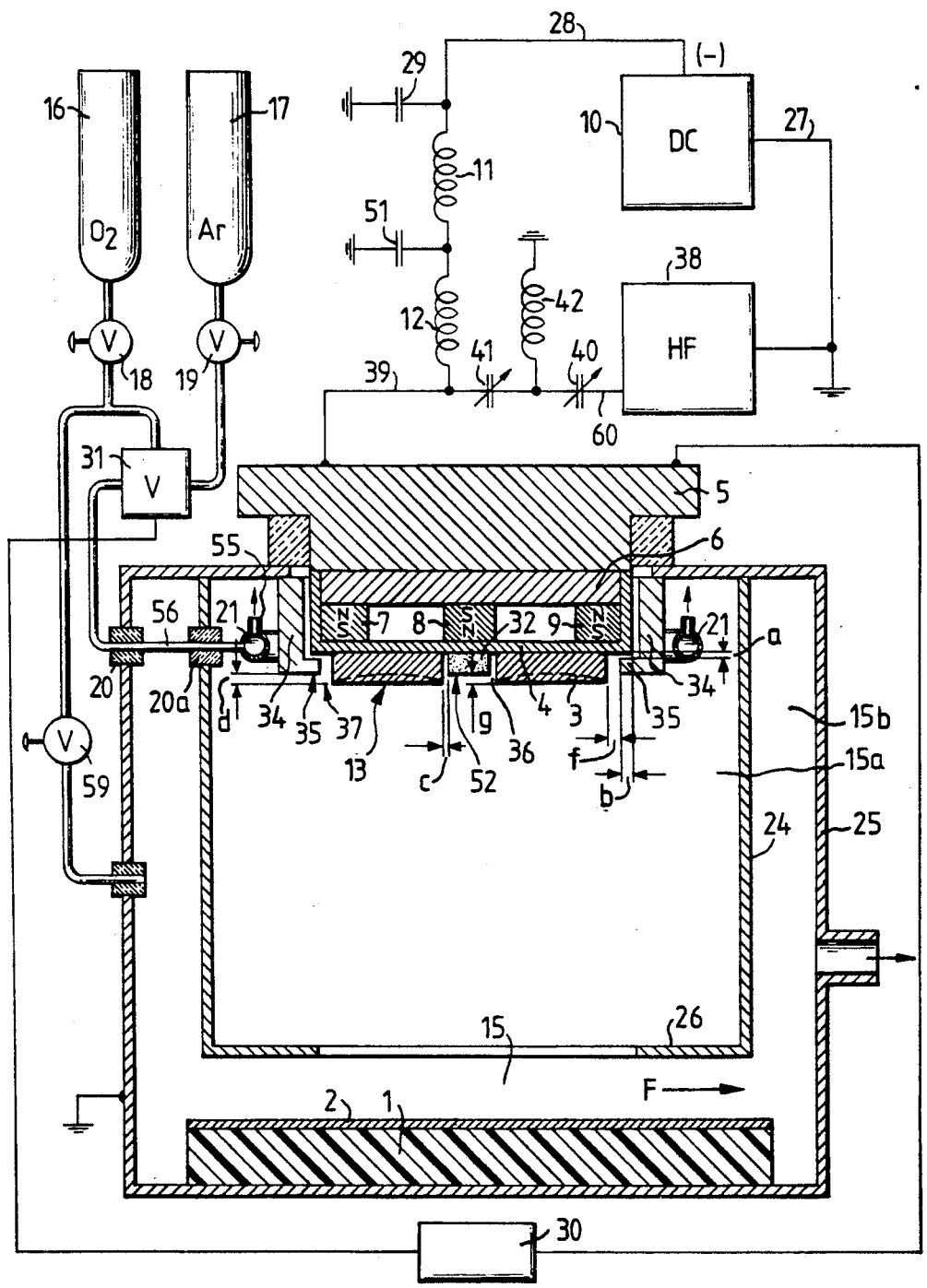

APPARATUS FOR COATING A SUBSTRATE

BACKGROUND OF THE INVENTION

The invention relates to an apparatus for coating a substrate, preferably with aluminum oxide, having a direct-current and/or an alternating-current source which is connected to an electrode disposed in an evacuable coating chamber which is connected electrically with a target which is sputtered and whose sputtered particles precipitate upon the substrate, such as a plastic piece. The coating chamber can be charged with a process gas, and toroidal magnetic fields pass through the target and their lines of force issue from the surface of the target in the area of the magnetic poles.

A cathode sputtering apparatus is known (German Patent Disclosure Document 27 07 144; Sloan Technology Corp.). It has a cathode which bears a surface to be sputtered, a magnet system near the cathode and at the side confronting the surface to be sputtered for the production of magnetic lines of force, at least some of which enter the surface to be sputtered and issue again therefrom, namely at intersection points lying at a distance from one another, between which the lines of force continuously form arcuate segments at a distance from the surface to be sputtered. The latter — together with the lines of force — form a boundary for a confined area whereby a tunnel-like area is formed, which lies over a path thereby defined on the surface to be sputtered. Charged particles tend to be held back in the tunnel-like area and to move along it. The apparatus also has an anode adjacent to the cathode, and the cathode and anode are connected to a source of electrical potential. At least the surface to be sputtered is situated within an evacuable container.

In this apparatus a driving means is provided for producing relative movement between the magnetic field and the surface to be sputtered, while retaining its spatial proximity. The abovementioned path runs across the surface to be sputtered, covering a surface area which is greater than the surface area occupied by the path at rest.

Also known (P 38 21 207.2, to which U.S. Pat. No. 4,931,169; corresponds Leybold AG) is a system for coating a substrate with dielectrics. It has a direct-current source which is connected to an electrode that is in electrical communication with a target which is sputtered, and whose sputtered particles enter into a compound with the delivered material, which precipitates on the substrate. Toroidal magnetic fields pass through the target and their lines of force issue from the surface of the target at the magnet poles. In this system an alternatingcurrent source is provided, whose output voltage is superimposed on the direct voltage of the direct-current source, while the electrical power of the alternating current source that is fed to the electrode corresponds to 5% to 25% of the power fed by the direct-current source to the electrode.

Lastly, in an older patent application Ser. No. (P 39 29 695.4, to which U.S. Pat. No. 5,026,471 corresponds) an apparatus for coating a substrate has been proposed, which is equipped with a direct-current and/or an alternating-current source connected to an electrode which is disposed in an evacuable coating chamber and electrically connected to a target which is sputtered and whose sputtered particles deposit themselves on the substrate. A process gas can be put into the coating chamber and magnetic fields pass through the target with their lines of force issuing from the surface of the target in the area of the magnetic poles.

In this apparatus the target has two substantially elongated, parallelepipedal portions, the ends of the two portions being joined by means of two arcuate target portions and thus together forming a ring-like or oval target.

The target in this apparatus is surrounded by a darkspace shielding whose circumferential margin or end surface facing the substrate is slightly set back from the front surface of the target. The magnet system disposed in a cathode tub and held on a yoke is composed of a central row of narrow magnets extending in the lengthwise direction of the target, an additional endless series of narrow magnets disposed at the marginal portion of the yoke, and two round magnets, one of the round magnets being located at each end of the central row of magnets.

SUMMARY OF THE INVENTION

It is the object of the present invention to create a system for the stable operation of complex, reactive sputtering processes. In particular, coatings of compounds such as $Al_2O_3$, $SiO_2$, $Si_3N_4$, ITO, $TiO_2$, $Ta_2O_5$, for example, are to be produced at high coating rates and in high quality, while especially the arcing that severely impairs the process is to be prevented.

This object is achieved in accordance with the invention in that the target has two parallel, substantially elongated, parallelepipedal portions, the ends of the two portions being connected by two arcuate target portions and forming with the latter a ring-shaped or oval target. The target is surrounded by a dark-space shielding whose circumferential margin facing the substrate overreaches the cathode tub such that the margin shields a narrow area of the end face of the cathode tub facing the substrate, but the margin extends at an insulating distance from the cathode tub. A magnet system disposed in the cathode tub and held on a yoke is formed of a central series of narrow magnets extending in the lengthwise direction of the target, and an additional endless series of narrow magnets disposed on the marginal portion of the yoke.

Preferably the magnets are held on a yoke whose width and length is less than those of the tub chamber defined by the cathode tub, while the pivot of a motor-driven cam or crank engages in a recess in the yoke and sets the yoke in a reciprocating movement within the tub chamber.

BRIEF DESCRIPTION OF THE DRAWING

The sole figure shows a sputtering system with a second target disposed centrally within a first target shaped to an oval ring.

DETAILED DESCRIPTION OF THE PREFERRED EMBODIMENT

In the drawing is shown a substrate 1 which is to be provided with a thin metal coating 2. Opposite this substrate 1 is a target which is to be sputtered. The ring-shaped target 3, which already surrounds a bar-shaped target 32, is connected by an element 4 of Ushaped cross section (a so-called cathode tub) to an electrode 5 which rests on a yoke 6 which encloses between itself and the element 4 three rows of permanent magnets 7, 8 and 9. The polarities of the poles of the permanent magnets 7, 8 and 9 directed at the target 3 alternate, so that in each case the south poles of the outer row of magnets 7 and 9 produce with the north pole of the middle row of permanent magnets 8 an approximately circular magnetic field through the target 3. This magnetic field compresses the plasma before the target 3, so that it has its greatest density where the magnet fields are maximum. The ions in the plasma are accelerated by an electrical field which builds up on the basis of a direct-current voltage which is provided by a direct-current source 10. The electrical field stands vertically on the surface of the target 3 and accelerates the positive ions of the plasma toward this target 3. In this manner a more or less great number of atoms or particles are knocked out of the target 3, especially from the regions 13 and 14 indicated in broken lines (sputter pits) where the horizontal component of the magnetic field reaches its peak. The sputtered atoms or particles migrate toward the substrate 1 where they deposit themselves in a thin layer 2.

The metal particles knocked out of the target 3 react in a space 15 on the substrate surface with certain gases which are fed into this chamber 15a from gas tanks 16 and 17 through valves 18, 19, 31 and 59 and an inlet connection 20, 20a, with a ring duct 21 having nozzles 55. This chamber 15a is formed by two vessels 24 and 25, the one vessel 25 containing the substrate 1 while the other vessel 24 ends opposite the substrate 1 and forms a mask 26. Both of the vessels 24 and 25, and hence also the substrate 1 which rests on the bottom of vessel 25, are electrically grounded. Also grounded is the second terminal 27 of the direct-current source 10, whose first terminal 28 is connected not only to the inductances 11 and 12 but also to the condensers 29 and 51, which in turn are grounded.

The gas is preferably fed to the second vessel 24 through a gas distributing system or ring duct with nozzles 55 which surrounds the cathode 5, and it furthermore enters into the interstice 15b between the first and the second vessel 24, 25.

To control the system depicted, a processing computer 30 can be provided, which processes the metered data and issues commands. The values of the measured partial pressure in processing chamber 25, for example, can be entered in this processing computer 30. On the basis of these and other data it can regulate, for example, the gas flow through the piezovalve 31 and adjust the voltage at the cathode 5. The processing computer 30 is also capable of regulating all other variables, such as cathode current and magnetic field strength, for example. Since such processing computers are known no description of its construction will be given.

As the drawing shows, both the U-shaped element and the cathode tub 4 as well as the ring-shaped target 3 with the central target 32 are surrounded by a dark-space shield 34, whose circumferential margin 35 on the substrate side projects by the dimension b beyond the marginal area of the cathode tub 4. Furthermore, between the central target 32 and the radially internal surfaces of the target 3 is an annular gap 36 (c=1 mm) and also an annular gap 37 between the radially external surfaces of the target 3 and the margin of the dark-space shield 34 (f=2 mm). The undesired arcing (i.e., the unwanted forming of electrical arcs) is prevented especially by the portion of the dark-space shield 34 overlapping the radially outer margin of the cathode tub 4.

Lastly it is also to be noted that the face 52 of the bar-shaped central target 32 is also set back a slight amount (g=1 mm) from the circular face 13, 14, of the target 3.

In addition to the DC current source 10 a high-frequency current source 38 is provided on the power supply line 39 and 60 with interposed condensers 40 and 41 and an inductance 42, which also permit the feeding of an alternating current to the electrode 5.

In the apparatus described, there is the assurance that a reactive gas discharge will burn stably in an argon reactive gas atmosphere in front of the magnetron cathode 5 with a target 3. It can involve either a direct-current discharge, a high-frequency discharge or a combination of both.

While it is not apparent from the drawing, the target 3 is a long target (oblong target) whose ends are rounded arcuately by circular pieces; that is, the oblong target has, in plan, the shape of an oval (with elongated parallelepipedal sides disposed parallel to one another).

This configuration is recommendable especially for a pure DC discharge. The target in this shape can be applied either to rectangular standard cathode tubs or on cathode tubs 4 especially made with round arches.

In one special embodiment the magnetic field is shaped so that the sputtering area on the target is as large as possible. Especially in the case of long cathodes with round-arch targets a magnetic field is recommended which is supported by two round magnets which are disposed at the diametrically opposite ends of the middle row of magnets 8.

The magnet arrangement of a preferred embodiment is characterized by the following features:
 a) The magnets 7, 8 and 9 are very narrow (e.g., c=5 mm) and have a high magnetic field strength (Vacudym magnets).
 b) At both ends of the middle row of magnets 8 are two round magnets of special size and strength, so that the target material is sputtered all the way to the edge at common discharge voltages.

In another embodiment of the invention the target together with the U-shaped yoke and the cathode tub is disposed on the electrode 5, while the permanent magnets or rows of magnets with their yoke are coupled to the pivot of a crank drive (not shown) which in turn can be driven by a shaft, and by which the yoke can be set into an oscillating movement, these movements being limited by the inside walls of the cathode tub 4. It is clear that in this case the dimensions of the yoke must be selected such (smaller) that sufficient space remains in the cathode tub for the oscillating movement.

In the case of long cathodes it is thus possible, using a rounded target, and using the corresponding magnet arrangement, to move the magnetic field in at least two modes such that, even in reactive sputtering, deposits on the target surface are prevented, namely
 a) a lateral reciprocating movement of the entire magnet yoke in the cathode tub 4, and
 b) a simultaneous movement of the magnet yoke in the cathode tub 4 in its lengthwise direction, so that the magnet system is moved back and forth laterally as well as lengthwise.

The system described above likewise prevents insulating coatings from forming on the target surface in reactive sputtering and causing instabilities in the discharge.

It is essential to prevent such instabilities in reactive sputtering, but experience shows that it can hardly be done under production conditions.

This is the case especially in a number of critical reactive sputtering processes such as, for example, the processes for producing $Al_2O_3$, $SiO_2$, $Si_3N_4$, ITO, $TiO_2$, $Ta_2O_5$), especially when high sputtering rates are desired.

I claim:

1. Apparatus for coating a substrate, comprising
an evacuable coating chamber,
an electrode comprising a cathode tub in said chamber, said electrode being connected to a current source,
a first target comprising two elongate parallel portions connected by two arcuate portions to form an oval target having a radially external surface and an exposed surface facing said substrate, said first target being situated on said cathode tub with a margin of said tub outside of said radially external surface,
a dark space shield surrounding said target and having a marginal portion overlapping said margin of said cathode tub but spaced therefrom, said marginal portion being spaced from said radially external surface to form an annular gap where said margin of said tub remains exposed, and
a magnet system disposed in said cathode tub and comprising a yoke having thereon a central row of magnets parallel to said elongate portions of said target and an endless series of magnets in a loop around said central row, said magnets being situated to form a magnetic field over said target.

2. Apparatus as in claim 11 wherein said marginal portion of said dark space shield has a surface facing said substrate which is recessed from the surface of said oval target which faces said substrate.

3. Apparatus as in claim 1 further comprising a second target within said oval target and separated therefrom by a circumferential gap, said second target being formed of a different material than said first target, said second target being mounted directly on said cathode tub so as to be at common potential with said first target.

4. Apparatus as in claim 3 wherein said second target has an exposed surface facing said substrate which is recessed from the surface of said oval target which faces said substrate.

5. Apparatus as in claim 1 further comprising
means including a valve for introducing a reactive gas in said chamber, said reactive gas being ionized by said current source to cause a discharge voltage between said target and said substrate, and
control means for regulating introduction of reactive gas through said valve so that the discharge voltage remains constant.

6. Apparatus as in claim 1 wherein said control means can regulate introduction of said reactive gas so that quality of coating on said substrate remains constant.

7. Apparatus for coating a substrate, comprising
an evacuable coating chamber,
an electrode comprising a cathode tub in said chamber, said electrode being connected to a current source,
a first target comprising two elongate parallel portions connected by two arcuate portions to form an oval target having a radially external surface and an exposed surface facing said substrate, said first target being situated on said cathode tub with a margin of said tub exposed around said target,
a second target within said oval target and separated therefrom by a circumferential gap, said second target being formed of a different material than said first target, said second target being mounted directly on said cathode tub so as to be at common potential with said first target.
a dark space shield surrounding said target and having a marginal portion overlapping said exposed margin of said cathode tub but spaced therefrom, said marginal portion being spaced from said radially external surface to form an annular gap where said margin of said tub remains exposed, and
a magnet system disposed in said cathode tub and comprising a yoke having thereon a central row of magnets parallel to said elongate portions of said target and an endless series of magnets in a loop around said central row, said magnets being situated to form a magnetic field over said target.

* * * * *

UNITED STATES PATENT AND TRADEMARK OFFICE
CERTIFICATE OF CORRECTION

PATENT NO. : 5,167,789
DATED : December 1, 1992
INVENTOR(S) : Rudolf Latz

It is certified that error appears in the above-indentified patent and that said Letters Patent is hereby corrected as shown below:

Col. 5, line 31      Claim 2 should depend
        (Claim 2)          from claim 1, not claim 9.

Signed and Sealed this

Twenty-first Day of February, 1995

Attest:

BRUCE LEHMAN

Attesting Officer        *Commissioner of Patents and Trademarks*